US005553150A

United States Patent [19]

Kozuki

[11] Patent Number: 5,553,150

[45] Date of Patent: Sep. 3, 1996

[54] REVERBERATION - IMPARTING DEVICE CAPABLE OF MODULATING AN INPUT SIGNAL BY RANDOM NUMBERS

[75] Inventor: Koichi Kozuki, Hamamatsu, Japan

[73] Assignee: Yamaha Corporation, Japan

[21] Appl. No.: 288,294

[22] Filed: Aug. 10, 1994

[30] Foreign Application Priority Data

Oct. 21, 1993 [JP] Japan .................................... 5-285681

[51] Int. Cl.[6] ........................................ H03G 3/00

[52] U.S. Cl. ........................................ 381/61; 381/63

[58] Field of Search ........................ 381/61–65, 31–32

[56] References Cited

U.S. PATENT DOCUMENTS 4,731,835 3/1988 Futamase et al. ........................ 381/63
5,000,074 3/1991 Inoue et al. ............................... 84/261
5,367,118 11/1994 Iwaooji .................................... 381/61
5,371,799 12/1994 Lowe et al. ............................... 381/63
5,444,784 8/1995 Toyama .................................... 381/61

*Primary Examiner*—Stephen Brinich
*Attorney, Agent, or Firm*—Graham & James LLP

[57] ABSTRACT

A reverberation-imparting device includes a delay line for storing a signal to which a reverberation effect is to be imparted. The delay line has at least one reading location determining timing for reading out the signal stored therein. An address generator generates basic reading address values for determining the at least one reading location. The basic reading address values are modulated by at least two different random numbers generated by a random number generator to determine reading address values. At least two signals read from the delay line are cross-faded, based on the modulated reading address values, such that the at least two signals are alternately intensified and attenuated with a predetermined phase difference. In a preferred application of the invention, the cross-faded at least two signals are output and delivered to a suitable reverberation-imparting device.

6 Claims, 6 Drawing Sheets

REVERBERATION - IMPARTING DEVICE CAPABLE OF MODULATING AN INPUT SIGNAL BY RANDOM NUMBERS

BACKGROUND OF THE INVENTION

1. Field of the Invention

This invention relates to a reverberation-imparting device which imparts delay effects such as reverberation to an input signal thereto.

2. Prior art

Conventionally, there have been proposed so-called reverberation-imparting devices which impart delay effects such as reverberation to input signals thereto in order to simulate various sound field spaces.

As a reverberation-imparting device of this kind, a reflective reverberation-imparting device has been proposed by the present assignee in Japanese Patent Publication (Kokoku) No. 1-57799, which is capable of generating a reverberation sound close to natural sound as well as varying its reverberation characteristics with ease.

FIG. 1 shows, by way of example, waveforms of a reflected sound signal created by the proposed reflective reverberation-imparting device. This device creates an initial reflected sound waveform F simulating a reflected sound obtained by an initial reflection of a sound by a wall or the like, and a subsequent reflected sound waveform (reverberation sound waveform) S simulating reflected sounds obtained by second and subsequent reflections of the sound by the wall or the like. The reflected sound obtained by the initial reflection has relatively small changes in frequency components and amplitude and is merely delayed as compared with the original sound, and therefore can be simulated by the initial reflected sound waveform F shown in FIG. 1. On the other hand, the reflected sounds obtained by the second and subsequent reflections have relatively large changes in frequency components and amplitude as compared with the original sound. Further, these reflected sounds obtained by the second and subsequent reflections have various delay amounts which are individually different, because of the repeated reflections before the original sound is attenuated. Moreover, each reflected sound obtained by each reflection has reduced high frequency components and an increased amount of reduction in amplitude as compared with its immediately preceding reflected sound. Therefore, these subsequent reflected sounds can be simulated by the subsequent reflected sound or reverberation sound waveform S shown in FIG. 1, which is formed by a plurality of waveforms of reflected sounds overlapping one upon another, i.e. highly dense, and progressively declining.

FIG. 2 schematically shows the arrangement of the proposed reflective reverberation-imparting device. Left and right signals (hereinafter referred as "the signal L" and "the signal R", respectively) of a 2-channel stereo signal are added together by an adder 101, and the resulting sum is delivered to an initial reflected sound waveform-forming section 102 which forms the above-mentioned initial reflected sound waveform F. The initial reflected sound waveform-forming section 102 generates three kinds of signals which are different in delay time, etc. from each other, one of which is Supplied to a subsequent reflected sound or reverberation waveform-forming section (hereinafter referred to as "the reverberation waveform-forming section) 103 which forms the above-mentioned subsequent reflected sound or reverberation sound waveform S, and the other two signals are supplied to respective adders 104 and 105. The reverberation waveform-forming section 103 operates in response to the signal from the initial reflected sound waveform-forming section 102 to form signals L' and R' for forming the subsequent reflected sound or reverberation sound waveform S. The formed signals L', R' are added to the respective two signals from the initial reflected sound waveform-forming section 102 at the adders 104, 105, and the resulting sums are added to the respective signals L, R before being subjected to the addition by the adder 101, at respective adders 106 and 107, so that the reflected sound or reverberation sound waveform S shown in FIG. 1 is obtained. In FIG. 2, each symbol "Δ" represents a multiplier for multiplying an input signal thereto by a predetermined coefficient.

The initial reflected sound waveform-forming section 102 is mainly comprised of a delay line 111 formed by a RAM, and a pair of adders 112 and 113. Results of the addition from the adder 101 are successively written into the delay line 111 at predetermined time intervals so that signals are stored into locations A1 to A6 and A7 to A12 which are arranged at intervals corresponding to respective different predetermined delay times. The signals read from the locations A1 to A6 and A7 to A12 are delivered to the adders 112 and 113. Results of additions from the adders 112, 113 are the above-mentioned two signals supplied to the adders 104, 105 for forming the initial reflected sound waveform F in FIG. 1. The delay line 111 successively generates signals, which correspond to respective signals from the adder 101 written into the delay line 111 and are each delayed by a predetermined delay time, through a reading output (reading location) B, in the order of writing into the delay line 111. The successive signals from the reading output B are delivered to the reverberation waveform-forming section 3.

The reverberation waveform-forming section 3 is comprised of a plurality of comb filters 125 each formed of a delay line 121, a low-pass filter (hereinafter referred to as "the LPF") 122 for filtering out or removing high frequency components in an output signal from the delay line 121 through a reading output (reading location) D thereof, a multiplier 123 for attenuating an output signal from the LPF 122, and an adder 124 for adding together the aforementioned signal from the delay line 111 and an output signal from the multiplier 123, adders 126 and 127, the adder 126 for adding together left-channel signals from some of the comb filters 125 and the adder 127 right-channel signals from the other comb filters 125, and two pairs of all-pass filters (hereinafter referred to as "the APF's") 128, 129; 130, 131, the APF's of each pair being serially connected to each other as well as to the respective adder 126, 127, for changing the phases of respective output signals from the adders 126, 127, delaying the same, etc. The APF's 128–131 are identical in structure with each other.

The delay lines 121 of the comb filters 125 each have reading outputs (reading locations) C1 and C2 thereof located relative to the other delay lines 121 such that different amounts of delay occur between the comb filters 125 to thereby ensure that output waveforms formed thereby will have high density enough to form the subsequent reflected sound or reverberation sound waveform S. The LPF's 122 of the comb filters 125 remove high frequency components in the feedback output from the delay lines 121, as stated above, in order to simulate a sound repeatedly reflected from a wall or the like, because as the number of times of reflections is larger, the attenuation amount of high frequency components in the repeatedly reflected sound increases. Further, the multipliers 123 serve to further simulate a repeatedly reflected sound which progressively declines in amplitude.

The APF's 128–131 serve to further increase the density of dense output waveforms from the comb filters 125 to thereby simulate natural reverberation sound with a higher degree of high fidelity.

FIG. 3 schematically shows the interior construction of the APF's 128–131. The APF's are each mainly composed of a delay circuit 131, and adders 132 and 133. The delay circuit 131 generates through a reading output (reading location) E thereof an output signal with a predetermined amount of delay relative to an input signal thereto.

The proposed reflective reverberation-imparting device constructed as above is capable of imparting delay effects such as a reverberation effect to an input signal thereto to form a reverberation sound fairly close to natural sound.

However, output Waveforms formed by the comb filters 125 necessarily have delay characteristics inherent in the comb filters 125 due to the finite number of the comb filters 125 employed, even though the delay lines 121 are set to different delay times from each other so as to increase the density of the subsequent reflected sound or reverberation sound waveform S to be obtained, and the APF's 128–131 further increase the density of the sound waveform S.

FIG. 4 shows, by way of example, output timing of a signal from one of the delay lines 121. The time interval of generation of output pulses from the delay line 121, i.e. delay time difference, is always constant due to the constant delay time, though different delay times are set between the individual delay lines 121. Consequently, the resulting reproduced sound has a frequency characteristic dependent upon the delay characteristic inherent in the delay circuit 121, which sometimes gives the listener a feeling of difference from actual reverberation sound listened to in a hall or the like.

SUMMARY OF THE INVENTION

It is an object of the invention to provide a reverberation-imparting device which is capable of creating a reverberation sound closer to natural sound.

To attain the above object, the present invention provides a reverberation-imparting device comprising: memory means for storing a signal to which a reverberation effect is to be imparted, the memory means having at least one reading location determining timing for reading out the signal stored therein; determining means for determining the at least one reading location; random number generator means for generating at least two different random numbers; at least two modulating means for modulating the at least one reading location by the at least two different random numbers generated by the random number generator means; cross-fade means for cross-fading at least two signals read from the memory means, based on results of the modulation by the modulating means, such that the at least two signals are alternately intensified and attenuated with a predetermined phase difference; and output means for outputting the cross-faded at least two signals.

Preferably, the cross-fade means generates at least two cross-fade signals alternately rising and declining in level with a predetermined phase difference, the at least two signals read from the memory means being alternately intensified and attenuated with the predetermined phase difference by the at least two cross-fade signals.

Also preferably, the at least two modulating means modulate the at least one reading location by the at least two cross-fade signals and the at least two different random numbers from the random number generator means.

Further preferably, the at least two modulating means include at least two latch means for latching the at least two different random numbers from the random number generator means at timing corresponding to rises or falls of the at least two cross-fade signals, the at least two modulating means modulating the at least one reading location by the at least two different random numbers latched by the latch means.

Preferably, the memory means has at least two reading locations being different in reading timing from each other.

In a preferred application of the invention, the reverberation-imparting device according to the invention is connectible to a second reverberation-imparting device comprising an initial reflected sound waveform-forming means having a plurality of reading locations being different in reading timing from each other, a subsequent reflected sound waveform-forming means having a plurality of delay filter means for delaying a signal from the initial reflected sound waveform-forming means with respective different delay times, the delay filter means having a plurality of reading locations being different in reading timing from each other, at least two first adder means for adding together outputs from the delay filter means, and at least two second adder means for adding together outputs from the at least two first adder means and outputs from the initial reflected sound waveform-forming means, the memory means having a writing input for inputting the signal to which the reverberation effect is to be imparted, the writing input being connectible to any of the reading locations of the initial reflected sound waveform-forming means or the reading locations of the delay filter means.

The above and other objects, features, and advantages of the invention will be more apparent from the following detailed description taken in conjunction with the accompanying drawings.

DETAILED DESCRIPTION

The invention will now be described in detail with reference to the drawings showing an embodiment thereof.

Figure 5:
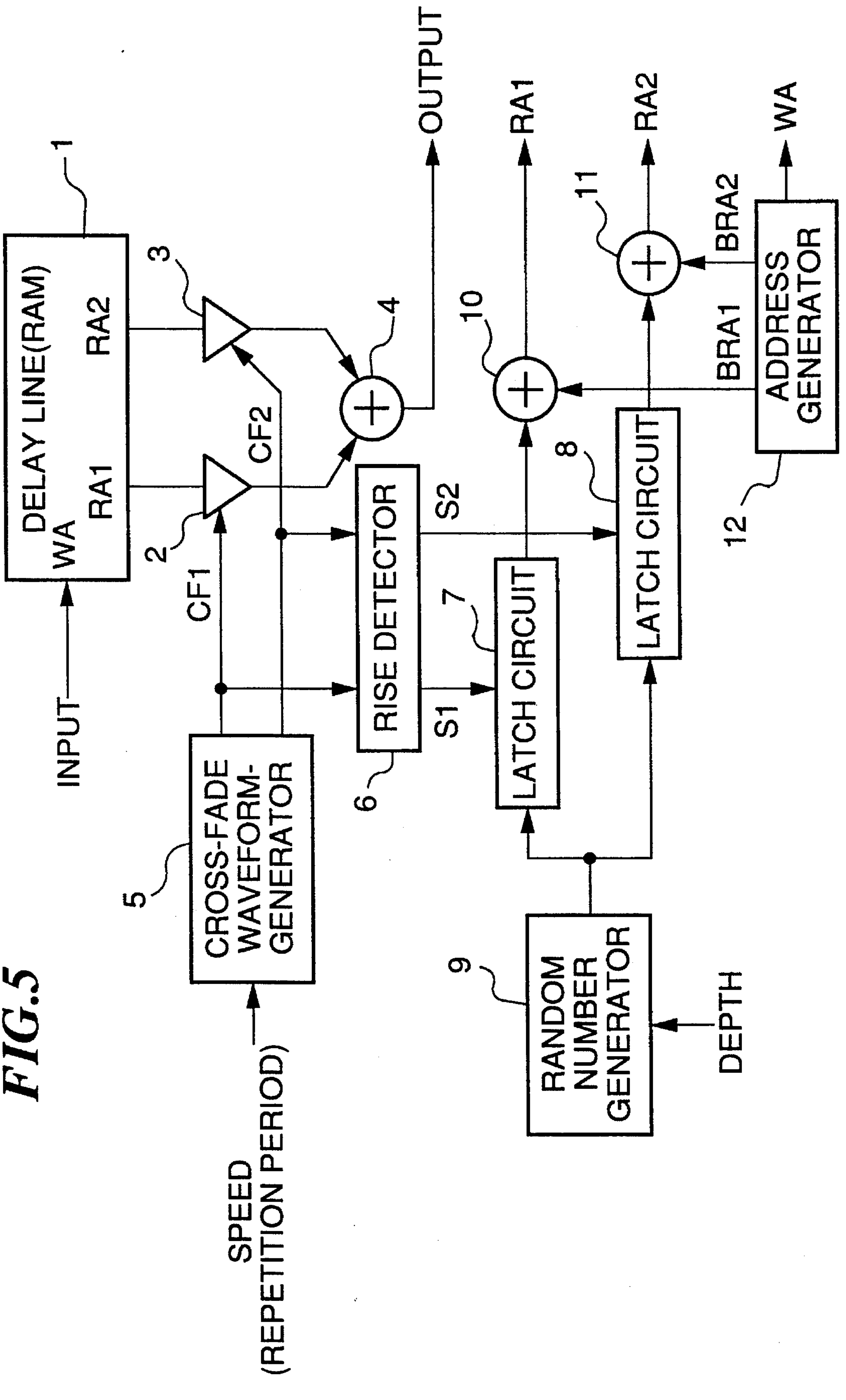
FIG. 5 is a schematic block diagram showing the arrangement of a reverberation-imparting device according to an embodiment of the invention.

Referring first to FIG. 5, there is schematically shown the arrangement of a reverberation-imparting device according to an embodiment of the invention. The reverberation-imparting device of this embodiment is not used alone, but is adapted to be used together with another suitable reverberation-imparting device such as the proposed one previously described with reference to FIG. 2, in a manner being connected thereto at a suitable part thereof, as in an application thereof, described later.

As shown in FIG. 5, the reverberation-imparting device according to the present embodiment is comprised of a delay line 1 formed by a RAM, which has a similar function to the delay line 111 of the conventional device in FIG. 2, multipliers 2 and 3, an adder 4 for adding together outputs from the multipliers 2, 3, a cross-fade waveform-generator 5 for generating cross-fade waveforms, hereinafter referred to, a rise detector 6 for detecting leading edges of outputs from the cross-fade waveform-generator 5, latch circuits 7 and 8 for latching input signals (random numbers) thereto, in response to leading edge-detection signals from the rise detector 6, a random number generator 9 for generating random numbers and supplying the same to the latch circuits 7, 8, an address generator 12 for generating address values, and adders 10 and 11 for adding together outputs from the address generator 12 and outputs from the latch circuits 7, 8.

An input signal to the reverberation-imparting circuit is first supplied to the delay line 1, which in turn generates outputs through two different reading outputs corresponding to respective different reading addresses RA1 and RA2, which are delivered to the multipliers 2, 3 connected, respectively, to the two reading outputs. The multipliers 2, 3 are, on the other hand, supplied with signals indicative of coefficients CF1 and CF2 (hereinafter referred to as "the cross-fade signals CF1, CF2) from the cross-fade waveform generator 5 to multiply the outputs from the delay line 1 by the cross-fade signals CF1, CF2, respectively, and supply the resulting products to the adder 4, where the two products are added together to be output to an external processing device such as the conventional reverberation-imparting device.

The cross-fade signals CF1, CF2 are generated from the cross-fade waveform generator 5. The cross-fade signals CF1, CF2 have cross-fade waveforms having speeds, i.e. repetition periods which are determined by the cross-fade waveform generator 5, based on a signal for determining the repetition periods from a speed (repetition period) generator, not shown. The cross-fade signals CF1, CF2 from the cross-fade waveform generator 5 are supplied to the rise detector 6 as well as to the multipliers 2, 3. Upon detecting a rise (leading edge) of the cross-fade signal CF1 output from the cross-fade waveform generator 5, the rise detector 6 generates and supplies a pulse S1 indicative of the detection of the rise to the latch circuit 7, and upon detecting a rise (leading edge) of the cross-fade signal CF2 from the generator 5, it generates and supplies a pulse S2 to the latch circuit 8. The latch circuits 7, 8 are also supplied with random numbers from the random number generator 9. The random number generator 9 is supplied with a depth signal for determining an output range of random numbers, from a depth generator, not shown.

Outputs from the latch circuits 7, 8 are delivered, respectively, to input terminals of the adders 10, 11, which have the other input terminals thereof supplied with address values from an address generator 12. Output signals indicative of the reading address values RA1 and RA2 from the adders 10, 11 and an output signal indicative of a writing address value WA are supplied to a memory controller, not shown, which controls the delay line 111 so as to write the input signal into an address designated by the writing address value WA and read data from addresses designated by the reading address values RA1, RA2 to be delivered to the multipliers 2, 3.

The address generator 12 generates basic reading address values BRA1 and BRA2 as well as the writing address value WA. The basic reading address values BRA1, BRA2 are added to respective outputs from the latch circuits 7, 8 into the reading address values RA1, RA2. The memory controller decrements these address values RA1, RA2, and WA every sampling interval, and the decremented address values are used for writing and reading:data into and out of the delay line 1, as stated above. If the outputs from the latch circuits 7, 8 are equal to "0", the address values RA1, RA2 become equal to the basic address values BRA1, BRA2, respectively. Since the address values RA1, RA2, and WA are thus progressively decreased every sampling interval in a uniform manner, there occurs no change in the difference between these address values, i.e. there occurs no change in the delay time. However, after the outputs from the latch circuits 7, 8 have been changed to random numbers in response to the pulses S1, S2, there occur changes between the address values RA1 and WA, and between the address values RA2 and WA, so that the delay time changes.

Figure 6:
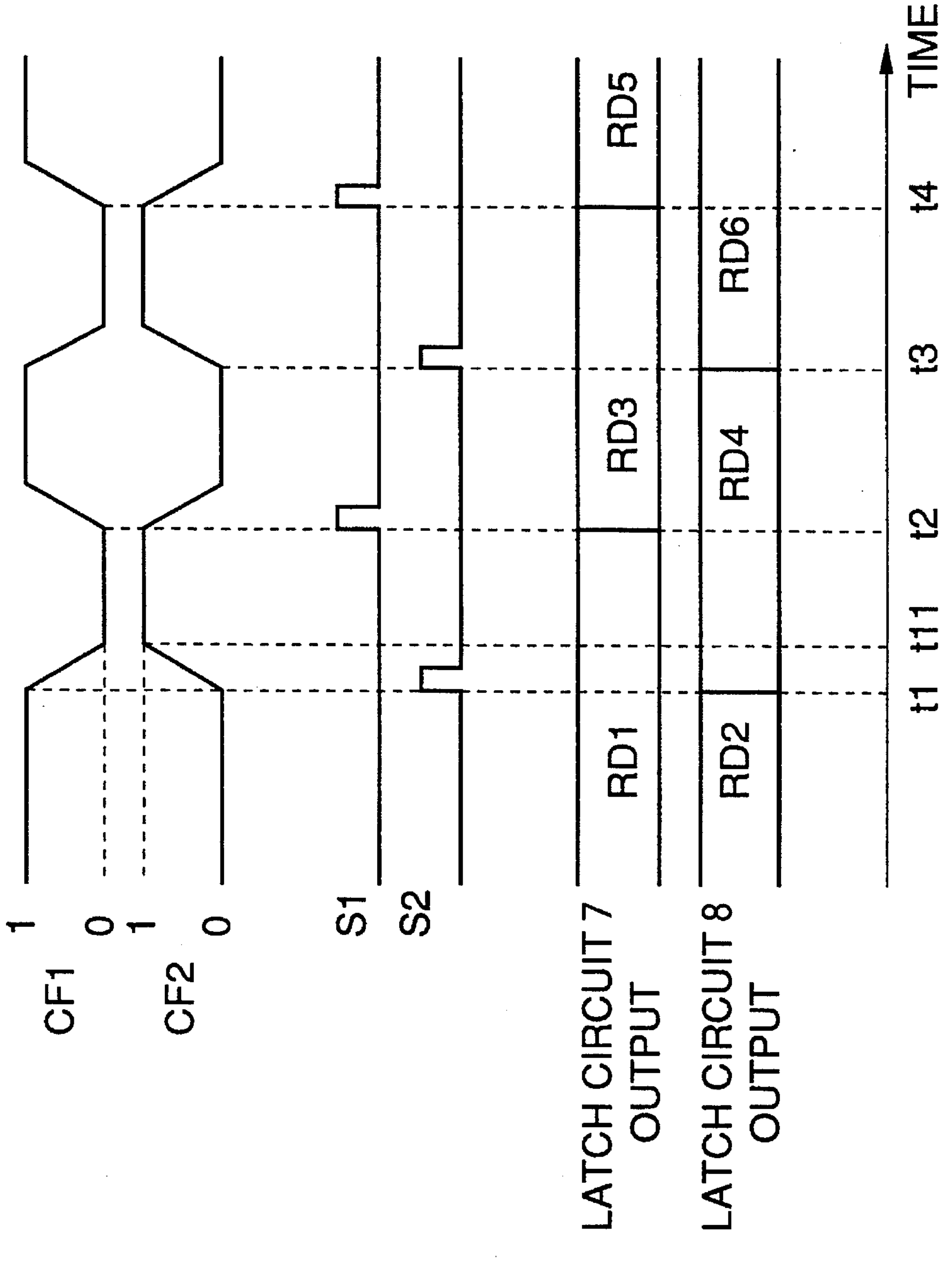
FIG. 6 is a timing chart showing timing of generation of signals at various parts of the device of FIG. 5.

The control operation of the reverberation-imparting device according to the present embodiment constructed above will now be described with reference to FIGS. 5 and 6. FIG. 6 shows, by way of example, the timing relationship between the cross-fade signals CF1, CF2, the pulses S1, S2 from the rise detector 6, and random number values RD1, RD2 from the latch circuits 7, 8.

As shown in FIG. 6, before a time point t1 the cross-fade signal CF1 from the cross-fade waveform generator 5 assumes a high level of "1", and the cross-fade signal CF2 from the generator 5 a low level of "0".

At this time, as shown in the figure, the latch circuit 7 latches and generates a random number value RD1 from the random number generator 9, while the latch circuit 8 latches and generates a random number value RD2 from the generator 9. Accordingly, the adder 10 adds together the random number value RD1 and the basic address value BRA1 from the address generator 12 to generate the sum as the reading address value RA1, and the adder 11 adds together the random number value RD2 and the basic address value BRA2 value from the address generator 12 to generate the sum as the reading address value RA2. Then, data read from an address of the delay line 1 designated by the reading address value RA1 is multiplied by the value of "1" of the cross-fade signal CF1 and the resulting product is delivered to the adder 4, whereas data read from an address of the delay line 1 designated by the reading address value RA2 is multiplied by the value of "0" of the cross-fade signal CF2 and the resulting product, that is, "0", is delivered to the adder 4. Consequently, only the data read from the address designated by the reading address value RA1 is output from the adder 4.

Then, at the time point t1, the cross-fade signal CF1 starts to rise, whereupon the rise detector 6 generates a pulse S2. Upon rising of this pulse S2, the latch circuit 8 latches a random number value RD4 then being generated from the random number generator 9. The latched random number value RD4 is added to the basic address value BRA2 from the address generator 12 at the adder 11, and the resulting sum is output as the reading address value RA2 to the memory controller. The memory controller operates in response to this reading address value RA2 to read data from an address of the delay line 1 designated by the reading address value RA2. On this occasion, data read from the address of the delay line 1 designated by the reading address value RA1 is multiplied by the cross-fade signal CF1 at the multiplier 2, and the data read from the address of the delay line 1 designated by the reading address value RA2 is multiplied by the cross-fade signal CF2 at the multiplier 3. The two kinds of data are added together by the adder 4 to be output. Then, from the time point t1 to a time point t2, the cross-fade signal CF1 progressively declines from "1" to "0", whereas the cross-fade signal CF2 progressively rises from "0" to "1". Accordingly, the output from the adder 4 progressively changes from the value of data read from the address of the delay line 1 designated by the reading address value RA1 toward the value of data read from the address of the delay line 1 designated by the reading address value RA2. Then, at the time point t2, the cross-fade signal CF1 starts to rise, whereupon the rise detector 6 generates a pulse S1, and the latch circuit 7 operates in response to this pulse S1 to latch a random number value RD3. The latched random number value RD3 and the basic address value BRA1 from the address generator 12 are added together at the adder 10 into the reading address value RA1, so that data is read from an address of the delay line 1 designated by the reading address value PA1. Thereafter, the output from the adder 4 progressively changes from the value of data read from an address of the delay line 1 designated by the reading address RA2 toward the value of data read from the address of the delay line 1 designated by the reading address RA1, with a progressive increase in the cross-fade signal CF1 and a progressive decrease in the cross-fade signal CF2.

Operations at time points t3 and t4 are similar to the above described operations at the time points t1, t2, description of which is therefore omitted.

Examples in which the present embodiment described above is actually applied to the device of FIG. 2 will be described.

Figure 1:
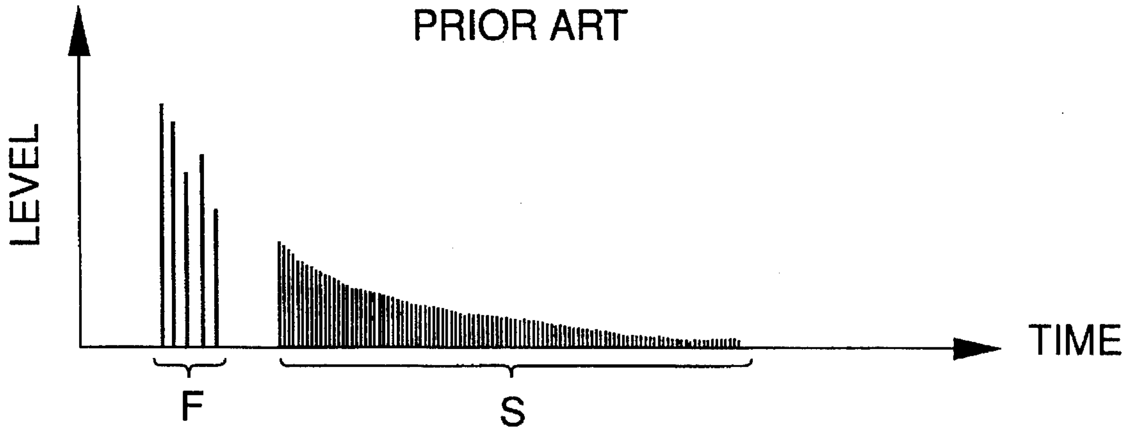
FIG. 1 is a schematic view showing waveforms of a reflected sound signal created by a conventional reflective reverberation-imparting device.
Figure 2:
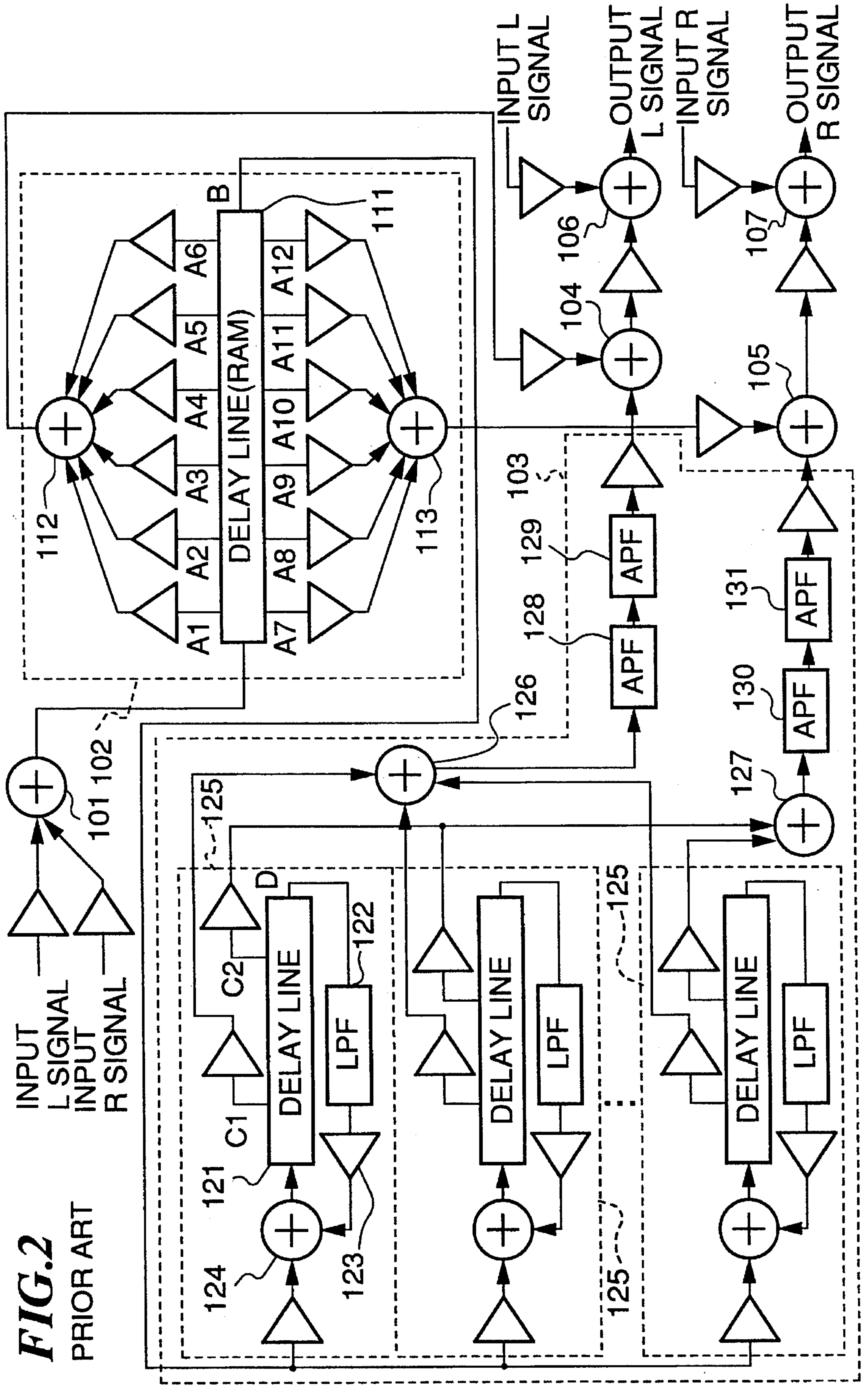
FIG.2 PRIOR ART
FIG. 2 is a schematic block diagram showing the arrangement of the conventional reflective reverberation-imparting device.
Figure 7:
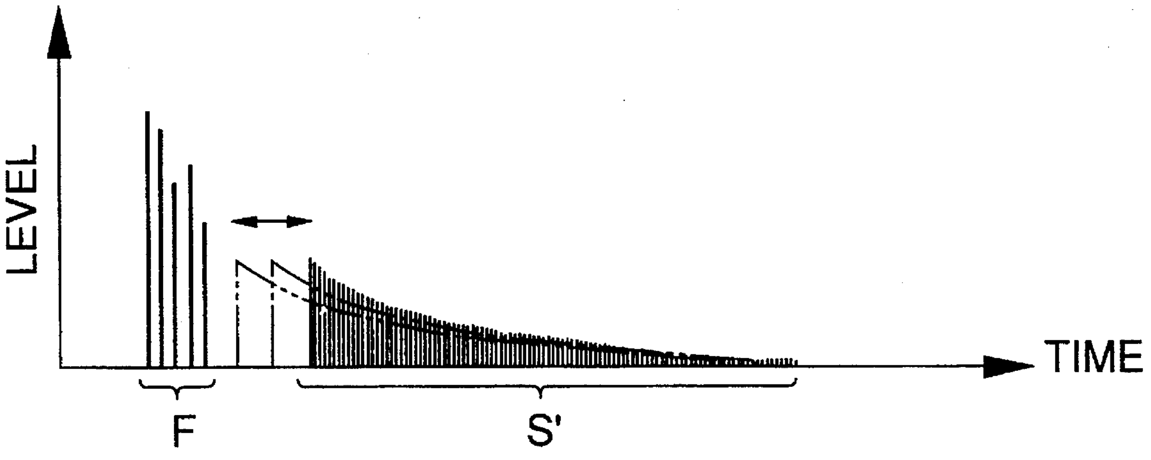
FIG. 7 is a view similar to FIG. 1, showing waveforms of a reflected sound signal created by an application of the embodiment of FIG. 5.

In a first application, the data input (write address WA of the delay line 1) of the present embodiment is connected to the reading output B in FIG. 2. Then, as shown in FIG. 7, an initial reflected sound waveform F is obtained, which is identical with one shown in FIG. 1. However, following the initial reflected sound waveform F, a subsequent reflected sound waveform (reverberation sound waveform) S' is obtained, which moves forward and backward at random timewise, as shown in FIG. 7.

Figure 4:
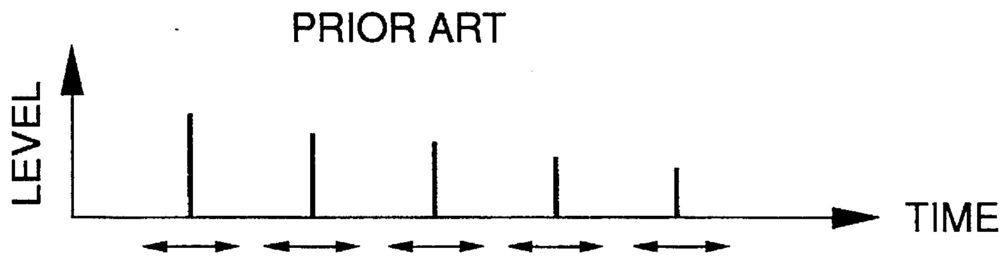
FIG. 4 is a timing chart showing, by way of example, output timing of a signal from one of delay lines appearing in FIG. 2.
Figure 8:
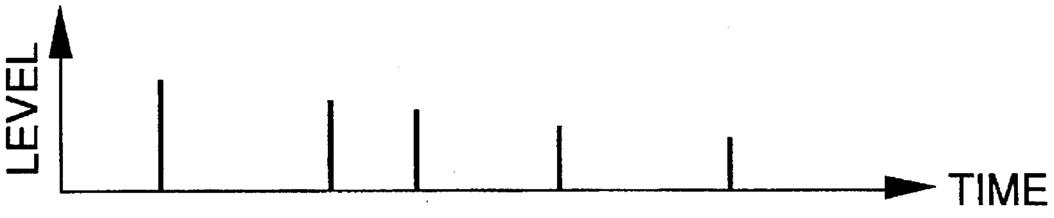
FIG. 8 is a view similar to FIG. 4, showing, by way of example, output timing of an output signal from the device of FIG. 5 connected to reading outputs D of comb filters appearing in FIG. 2.

In a second application, the data input of the present embodiment is connected to the reading output D in FIG. 2. Then, as shown in FIG. 8, the time interval of generation of output pulses from the delay line 121, i.e. delay time difference, varies at random, as distinct from the time interval shown in FIG. 4.

As exemplified above, if the device according to the present invention is connected to outputs of the prior art reverberation-imparting device, the time delay amount of the output from the latter device varies at random due to the use of random numbers, thereby eliminating delay characteristics inherent in the circuitry and hence enabling to create a reverberation sound closer to natural sound.

Figure 3:
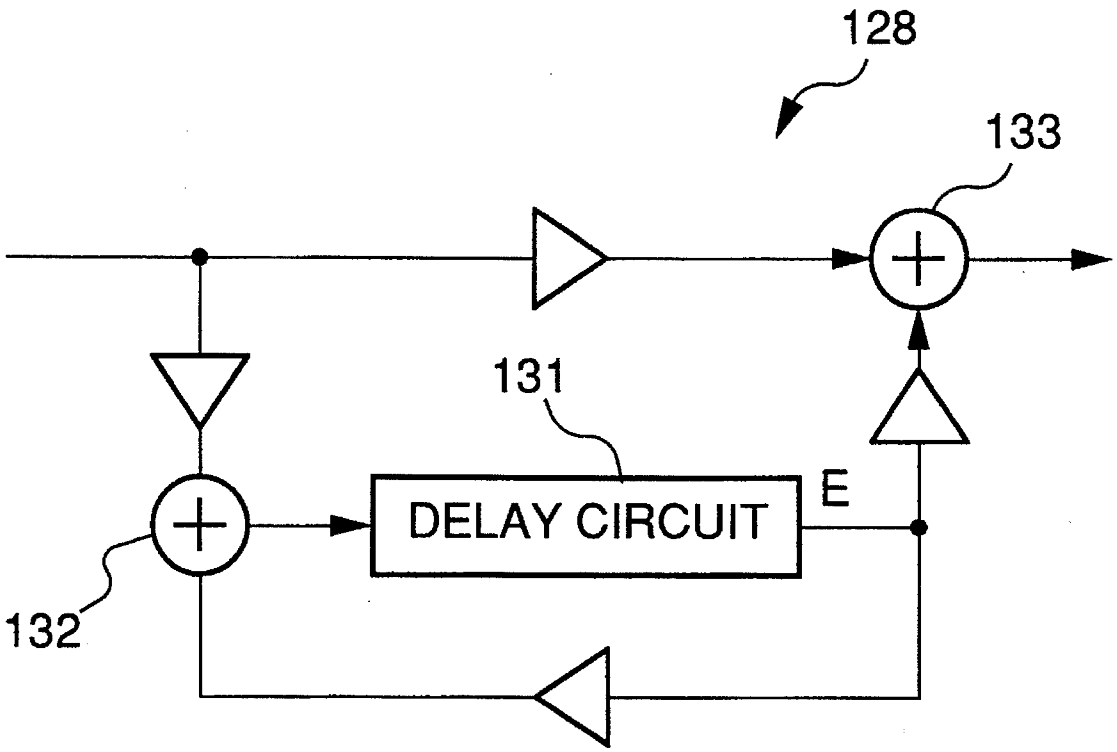
FIG.3 PRIOR ART
FIG. 3 is a schematic block diagram showing the interior construction of one of APF's appearing in FIG. 2.

Although in the above described applications, the device according to the embodiment of the invention is connected to the reading outputs B, D in FIG. 2, this is not limitative, but it may be connected to any of the locations or reading outputs A1 to A12, C1, C2 in FIG. 2 or E in FIG. 3. Further, the device according to the embodiment may be connected to two or more locations of a device like one in FIG. 2, at the same time, whereby better results may be obtained.

Although in the above described embodiment the basic reading address values BRA1, BRA2 from the address generator 12 are set to different values from each other, they may be set to the same value, because the output from the random number generator 9 is latched by the latch circuits 7, 8 at different timing, so that there is very little possibility that the outputs from the latch circuits 7, 8, hence the sums of the same outputs and the basic reading address values BRA1, BRA2 which are different from each other, become identical with each other.

Further, although in the above described embodiment the invention is realized by a hardware construction, alternatively part of the circuit of FIG. 5 may be replaced by software. For example, the rise detector 6, the latch circuits 7, 8, and the random number generator 9 may be implemented by software executed by a microcomputer.

The time intervals at which random numbers are latched by the latch circuits 7, 8 depend upon the repetition period of the cross-fade signals CF1, CF2. If the repetition period is too short, the cross-fade frequency becomes higher, which degrades the phase characteristic. Therefore, the repetition period should be set to an optimal value by a listening test. The optimal values of the above repetition period and the depth of random numbers from the random number generator depend upon the reading output(s) or location(s) to which the device according to the invention is connected. In most cases, they depend upon the range of delay time that data output from the reading output(s) or location(s).

Moreover, although in the above described embodiment the reading address values RA1, RA2 are varied by adding together the outputs from the latch circuits 7, 8 and the basic reading address values BRA1, BRA2, alternatively they may be modulated by multiplying basic reading address values by coefficients based on random numbers.

Further, although in the above described embodiment, random numbers from the random number generator 9 are latched by the latch circuits 7, 8 at timing corresponding to rises (e.g. leading edges) of the cross-fade signals CF1, CF2, alternatively, they may be latched at timing corresponding to falls (e.g. trailing edges) of the cross-fade signals CF1, CF2.

As described above, according to the invention constructed as above, delay characteristics inherent in the circuitry of the device can be eliminated, to thereby enable to create a reverberation sound closer to natural sound. Besides, by virtue of the use of cross-fade means, the delay time is not abruptly varied, whereby noise can be avoided.

What is claimed is:

1. A reverberation-imparting device comprising:

memory means for storing a signal to which a reverberation effect is to be imparted, said memory means having at least one reading location determining timing for reading out said signal stored therein;

determining means for determining said at least one reading location;

random number generator means for generating at least two different random numbers;

at least two modulating means for modulating said at least one reading location by said at least two different random numbers generated by said random number generator means;

cross-fade means for cross-fading at least two signals read from said memory means, based on results of said modulation by said at least two modulating means, such that said at least two signals are alternately intensified and attenuated with a predetermined phase difference; and output means for outputting a result of said cross-fading of said at least two signals.

2. A reverberation-imparting device as claimed in claim 1, wherein said cross-fade means generates at least two cross-fade signals alternately rising and declining in level with a predetermined phase difference, said at least two signals read from said memory means being alternately intensified and attenuated with said predetermined phase difference by said at least two cross-fade signals.

3. A reverberation-imparting device as claimed in claim 2, wherein said at least two modulating means modulate said at least one reading location by said at least two cross-fade signals and said at least two different random numbers from said random number generator means.

4. A reverberation-imparting device as claimed in claim 3, wherein said at least two modulating means include at least two latch means for latching said at least two different random numbers from said random number generator means at timing corresponding to rises or falls of said at least two cross-fade signals, said at least two modulating means modulating said at least one reading location by said at least two different random numbers latched by said latch means.

5. A reverberation-imparting device as claimed in any of claims 1 to 4, wherein said memory means has at least two reading locations being different in reading timing from each other.

6. A reverberation-imparting device as claimed in any of claims 1 to 4, said device being connected to a second reverberation-imparting device, the second reverberation-imparting device comprising an initial reflected sound waveform-forming means having a plurality of reading locations being different in reading timing from each other, a subsequent reflected sound waveform-forming means having a plurality of delay filter means for delaying a signal from said initial reflected sound waveform-forming means with respective different delay times, said delay filter means having a plurality of reading locations being different in reading timing from each other, at least two first adder means for adding together outputs from said delay filter means, and at least two second adder means for adding together outputs from said at least two first adder means and outputs from said initial reflected sound waveform-forming means, said memory means having a writing input for inputting said signal to which said reverberation effect is to be imparted, said writing input being connected to at least one of said reading locations of said initial reflected sound waveform-forming means or said reading locations of said delay filter means.

* * * * *